United States Patent [19]

Cohen

[11] 4,142,947

[45] Mar. 6, 1979

[54] ELECTRODEPOSITION OF POLYCRYSTALLINE SILICON FROM A MOLTEN FLUORIDE BATH AND PRODUCT

[76] Inventor: Uri Cohen, 1165 Road 22, Apt. 47, North Plainfield, N.J. 07060

[21] Appl. No.: 796,231

[22] Filed: May 12, 1977

[51] Int. Cl.$^2$ .................. C25D 3/66; C25D 9/08; B32B 15/04
[52] U.S. Cl. ................... 204/39; 204/DIG. 9; 428/450; 428/913
[58] Field of Search ............ 204/39, 60, DIG. 9; 136/89; 428/913, 450, 620

[56] References Cited

U.S. PATENT DOCUMENTS

| Re. 25,630 | 8/1964 | Cook | 204/39 |
|---|---|---|---|
| 2,982,763 | 6/1959 | Stern et al. | 204/60 |
| 3,022,233 | 2/1962 | Olstowski | 204/60 |
| 3,219,561 | 11/1965 | Monnier et al. | 204/60 |
| 3,254,010 | 5/1966 | Monnier et al. | 204/60 X |
| 3,983,012 | 9/1976 | Cohen | 204/15 |

FOREIGN PATENT DOCUMENTS 1080589  8/1967  United Kingdom .................. 204/60

OTHER PUBLICATIONS

John H. Lamneck, Jr. et al., 9th IEEE Photovoltaic Specialists Conf., pp. 193-195, May. 1972.

*Primary Examiner*—G. L. Kaplan
*Attorney, Agent, or Firm*—Flehr, Hohbach, Test, Albritton & Herbert

[57] ABSTRACT

A method for electrodeposition of polycrystalline silicon from a molten fluoride bath onto a metal cathode which is essentially non-alloying with silicon (e.g., silver, tungsten, niobium). The silicon is deposited as a continuous coherent, firmly-retained, non-spongy layer of large columnar grains on the substrate.

19 Claims, No Drawings

ELECTRODEPOSITION OF POLYCRYSTALLINE SILICON FROM A MOLTEN FLUORIDE BATH AND PRODUCT

BACKGROUND OF THE INVENTION

The present invention relates to the formation of a continuous polycrystalline silicon layer on a metal substrate, particularly for solar cell application.

Epitaxial crystal layers of germanium or silicon have been electrodeposited onto a single crystal substrate formed of germanium or silicon as set forth in my U.S. Pat. No. 3,983,012. The substrate forms the cathode of an electrolytic cell containing a molten fluoride electrolytic salt bath including a salt source of silicon plating ion. The foregoing patent stresses the importance of maintaining the bath in an essentially oxygen-free environment and discloses an advantageous way for accomplishing this objective.

SUMMARY OF THE INVENTION AND OBJECTS

In accordance with the present invention, silicon is electrodeposited in a polycrystalline layer onto a metal substrate which is essentially non-alloying with silicon and which forms the cathode of an electrolytic cell. Preferable substrates include silver, tungsten, and niobium. A suitable electrolytic cell includes a fused salt bath with a salt source of silicon and an alkali metal fluoride solvent. Passage of a current through the bath at optimum current density causes the electrodeposition of silicon as a continuous coherent, firmly-retained, non-spongy polycrystalline layer of large columnar grains (e.g., average grain size of at least 20 microns). Higher current densities, e.g., as high as 300 mA/cm$^2$ can be employed for a rapid silicon growth of solar cell grade level but which may be loose and spongy.

It is a general object of the invention to provide a method for electroplating polycrystalline silicon from a molten fluoride salt bath.

It is a particular object of the invention to provide a system of the foregoing type in which the silicon so deposited is continuous, dense, coherent, firmly-retained, non-spongy polycrystalline layer on a metal substrate.

It is another object of the invention to form a silicon polycrystalline layer of large columnar grain form.

It is another object of the invention to provide a polycrystalline silicon layer which can be electrodeposited at relatively high growth rates at correspondingly high current densities.

Further objects and features of the present invention will be apparent from the following description in which the preferred embodiments are set forth in detail.

DETAILED DESCRIPTION OF THE PREFERRED EMBODIMENTS

It has been discovered that continuous polycrystalline silicon films of large columnar grain structure may be deposited from molten fluoride baths onto selected metal substrates. In general, the structure of the electrolytic cell and the composition of the plating solution are of the type set forth in the aforementioned U.S. Pat. No. 3,983,012, the disclosure of which is incorporated herein by reference. The cathode and anode are connected to a suitable source of electrical current. The anode may comprise a noble metal e.g., gold or carbon to evolve fluoride gas. Alternatively, the anode may comprise a dissolving source of high-grade silicon.

The electrolytic bath comprises a salt source of plating ion (solute) and an electrolytic solvent for the salt source. Suitable solutes include alkali metal silicon fluoride, ammonium silicon fluoride, calcium silicon fluoride, barium silicon fluoride, and silicon tetrafluoride. Specific solutes include the sodium, lithium, potassium, and ammonium salts of silicon hexafluoride. Dipotassium silicon hexafluoride is a preferred salt because of its ready availability.

A suitable solvent for the electrolytic salt bath is a conventional fused salt mixture comprising at least one alkali metal fluoride. As it is advantageous to carry out the process at the lowest temperature at which the bath remains molten, it is preferable to employ a eutectic mixture of solvents. A solvent which can be employed for the foregoing solute is a eutectic mixture of potassium fluoride and lithium fluoride in a 1:1 molar ratio, and melting point of 492° C. Another suitable solvent is a eutectic mixture of lithium fluoride, potassium fluoride, and sodium fluoride in a molar ratio of 45.5% to 11.5% to 42.8% at a melting point of 454° C. This composition is commonly referred to by the designation "Flinak."

The same general principles of plating ion salt and solute concentration as set forth in the aforementioned U.S. patent are applicable in the present application. Thus, suitable concentrations of solute may be on the order of 1 to 10 mole percent.

The lower temperature limit is determined by the melting point of the fused electrolytic salt bath which, in turn, is dependent upon the concentration of solute in the bath. As set forth in the above U.S. patent, a suitable temperature range is from 650° C. to 800° C.

It has been discovered that electrodeposition at a selected current density from a bath of the foregoing type onto a particular metal substrate as the cathode of the bath forms a continuous coherent, firmly-retained, non-spongy polycrystalline layer on such substrate. The metal substrate is essentially non-alloying with silicon under the conditions of electrodeposition. By this is meant that either the substrate is incapable of forming a silicide with silicon or the rate of electrodeposition is so much greater than the rate of interdiffusion of the deposited silicon and the substrate metal that only a minor quantity of an underlying silicide layer is capable of forming. Silver is an example of the former type of substrate and is preferable because the lack of underlying silicide layer results in better adherence and uniformity. Tungsten and niobium represent the latter type of substrate.

The substrate can influence the grain size of the deposited polycrystalline silicon. It is preferable for solar cell applications that the average grain size be maximized to prevent loss of efficiency of the layer due to high resistivity and dissipative recombination of the fine grain boundaries for such applications as solar cells. The grain size is also influenced by the current density. It has been found that the polycrystalline silicon may be electrodeposited by the present technique with an average grain diameter in excess of 20 microns and as high as 40-50 microns or more.

The choice of substrates can determine the firmness of retention of the electrodeposited layer and also the grain diameter of the polycrystalline silicon. Thus, the polycrystalline silicon is very firmly adherent to silver and tungsten and forms coatings with grain diameters of as high as 50 microns. On the other hand, silicon crystallites with less adherence may be formed with grain diameters of as high as 500 microns on niobium metal substrates.

It is believed that silicon coatings are more uniform and adherent on silver substrates than on tungsten or niobium substrates due to the easier nucleation on silver, probably because there is a lack of underlying diffused silicide alloy with silver. In contrast, tungsten and niobium form silicides although have relatively small amounts. Also, silver is more ductile and may easily conform to the stresses created by non-matching thermal expansion coefficients.

The current density determines the rate of the electrodeposited polycrystalline silicon. Higher current densities and thus faster plating rates may be employed than those set forth in the above U.S. patent for the growth of epitaxial layers. It has been found that continuous coherent, firmly-retained, non-spongy polycrystalline layers may be formed at current densities from 0.1 milliamperes to as high as 30–50 milliamperes to 100 milliamperes per square centimeter. At the lower end of this range (e.g., 0.1–30 mA/cm$^2$), a non-spongy layer is formed. At the upper end of this range (e.g., to 100 mA/cm$^2$), to form a polycrystalline layer of a non-spongy type, it is preferable to apply the current by an alternating square wave pulse technique. Such technique has previously been employed for niobium as set forth in a paper by Uri Cohen and R. A. Huggins, entitled "High Rate Electrodeposition of Niobium from Molten Fluorides Using Alternating Square Wave Pulses," Electrochem. Soc. Meeting, Dallas, Texas, Oct. 5–10, 1975 (Abst. No. 147), incorporated herein by reference. It has been found that using this technique at cathodic current densities as high as 300 mA/cm$^2$ silicon deposits are yielded with cathodic current efficiencies of at least 80%, typically as high as 95%.

The present invention can also be employed to deposit silicon onto metal substrates of the foregoing type at rates in excess of those set forth above, e.g., as high as 300 milliamperes per square centimeter. At such current densities, a growth rate of about 5 microns per minute may be obtained. However, the deposited silicon tends to be spongy in nature. At such high current densities, the alternating square wave pulse technique is preferable.

It is believed to be important to the above system to remove essentially all oxides prior to electroplating to form an essential oxygen-free environment. Otherwise, the presence of water, vapor and other oxides in the system could cause a thin silicon oxide layer to form on the substrate which would impede the plating silicon ions from depositing. An excellent technique to accomplish this removal of oxides is fully set forth in the above U.S. patent and is incorporated herein by reference.

In accordance with the technique of that patent, a reagent chemically reactive with oxides in the electrolytic bath is added to the bath to form a reaction product which is removed from the vicinity of the cathode in the bath. In a preferred method, the reactant is hydrogen fluoride and the reaction product, water, is vaporized and removed from the electrolyte by the application of a vacuum.

In the foregoing specific technique, the hydrogen fluoride or other oxide reactive reagent may be supplied separately to the bath. However, it is preferable to supply the source of the compound in salt form which decomposes at the melting temperature of the bath maintained during the oxide removal step. Thus, an alkali metal hydrogen difluoride may be supplied to the melt, e.g., potassium hydrogen difluoride. At the melting point of a typical bath, e.g., 700° C., this salt is decomposed into potassium fluoride and hydrogen fluoride.

The hydrogen fluoride should be present in sufficient quantity to react with any oxide ion in the bath to form water vapor. Since this quantity is likely to be very small, as little as 1 to 10 mole percent of hydrogen fluoride or a source of the same provides a stoichiometric excess. If a eutectic mixture is to be maintained to accomplish the desired low melting point, appropriate modifications of the proportions of electrolyte may be made. For example, for each mole of potassium hydrogen difluoride employed as a reagent reactive with oxygen, the mole percent of potassium fluoride initially present is correspondingly reduced.

During the above reaction of oxides and hydrogen fluoride, the resulting water vapors are suitably drawn off together with other dissolved gaseous impurities such as oxygen and other sources of water vapor by the application of a vacuum. The gases withdrawn may be corrosive to the vacuum system. Accordingly, a vapor trap is disposed in the path intermediate the bath and vacuum source. A suitable trap includes a bath of coolant such as liquid nitrogen.

The removal of oxide impurities is preferably performed by reaction of the oxides to form a gaseous reaction product as set forth above. However, the oxide reaction product may also be separated from the melt if it forms a precipitate. For example, a material such as dipotassium zirconium hexafluoride, may be added to the melt and permitted to react with the oxide to form highly insoluble zirconium oxide which is precipitated away from the vicinity of the cathode.

After purification of the bath as set forth above, it may be cooled and transferred to a clean chamber and remelted. Prior to application of current, an inert gas such as helium is bubbled through the electrolytic bath to expel any further dissolved gases such as hydrogen fluoride. Then, a cathode and anode of the foregoing type are inserted into the molten bath together with a bubbler for inert gas such as helium. After lowering of the electrodes into the bath, an anodic short pulse may be applied to the substrate for etching the same. Then, a constant current is applied across the cell using conventional direct current source such as a potentiostat or constant current power supply. The inert gas atmosphere is maintained over the bath during electrolysis.

Although silver is an excellent substrate for electrodeposition of silicon, it is relatively expensive. Thus, it may be desirable to employ silver or other non-alloying coating as a protective layer over a less expensive body such as formed of stainless steel or nickel. The latter materials are capable of alloying with the silicon under the conditions of electrodeposition unless so protected. In this embodiment, the silver coating should be formed in a continuous non-porous layer, essentially impervious to diffusion under the conditions of electrodeposition.

A further disclosure of the nature of the present invention is provided by the following specific examples of the practice of the invention. It should be understood that the data disclosed serve only as examples and are not intended to limit the scope of the invention.

EXAMPLE 1

A molten bath is formed containing 5 mole percent of dipotassium silicon hexafluoride solute dissolved in a solvent comprising a eutectic mixture of potassium fluoride and lithium fluoride with potassium hydrogen difluoride (10%) substituted for an equal molar portion of potassium fluoride.

The bath is purified prior to electrolysis as follows. The bath is melted at 750° C. under vacuum. The evolving hydrogen fluoride reacts with oxygen impurities present to form water vapor which is drawn off by the vacuum together with other volatile gases. The water vapor and the excess hydrogen fluoride are removed from the vacuum stream by a liquid nitrogen trap. Then the melt is purged with helium to remove the remaining dissolved hydrogen fluoride from the bath.

In one series of runs, coatings of polycrystalline silicon were deposited with the above bath at 750° C. at a constant cathodic current of 2 milliamperes per square centimeter onto a tungsten substrate. Although the tungsten forms thin diffused silicide alloy coatings, the rate of deposition far exceeded that of the diffusion at the operating temperatures. Non-uniform silicon deposit of large grain crystallites was obtained. Improvements of the deposit uniformity were achieved by first electroplating at 4 milliamperes per square centimeter for three minutes and then at 2 milliamperes per square centimeter thereafter (for 14 hours). The initial period of higher current density enhanced nucleation thereby improving uniformity. The entire substrate surface was covered with a silicon deposit of large grain diameter with good uniformity and adherence.

EXAMPLE 2

The above procedure was followed with the use of a silver substrate and a current density of 6 milliamperes per square centimeter. Polycrystalline silicon coating with grain size of 10–20 microns, was uniform, coherent and with excellent adherence to the substrate.

Improvements of the deposit grain size were achieved by first electroplating at 3 milliamperes per square centimeter for three minutes onto the silver substrate, and then at 6 milliamperes per square centimeter thereafter. The initial period of lower current density helped to decrease the nucleation density at the silver substrate. The silicon coating was uniform and well adherent with grain diameters of 20–50 microns.

EXAMPLE 3

The above procedure was followed with the use of a niobium substrate and a current density of 0.5 milliamperes per square centimeter. Large crystallites of polycrystalline silicon, up to 500 microns, were deposited loosely attached to the substrate.

EXAMPLE 4

The foregoing procedure was modified by applying the alternating square wave pulse (ASWP) technique for deposition onto tungsten substrates. Cathodic pulses of 40 milliamperes per square centimeter and 5 seconds, and anodic pulses of 200 milliamperes per square centimeter and 0.5 second were employed. Continuous and well adherent polycrystalline silicon coatings with grain size of 10–20 microns were observed.

EXAMPLE 5

The procedure of the previous example was followed employing the alternating square wave pulse technique with cathodic pulses of 300 milliamperes per square centimeter and 3 seconds, and anodic pulses of 450 milliamperes per square centimeter and 1 second. The deposit became dome-like with the domes being composed of loose, fibrous deposit.

What is claimed is:

1. A method for electrodepositing a polycrystalline silicon onto a substrate comprising the cathode of an electrolytic cell, comprising the steps of
   (a) forming a molten fluoride electrolytic salt bath for said electrolytic cell including a source of silicon and a solvent,
   (b) removing essentially all oxides from the electrolytic bath by the following steps:
      (1.) applying a vacuum to the bath,
      (2.) supplying in the bath a source of reagent chemically reactive with oxide ions in sufficient quantity to react with any oxide ion in the bath,
      (3.) reacting said oxygen reactive reagent with oxygen in the bath at a molten bath temperature, and
      (4.) removing the reaction product from the bath,
   said cathode including an electrodeposition substrate formed of a metal which is essentially non-alloying with silicon under the conditions of electrodeposition,
   (c) passing a current between an anode in said bath and said cathode at sufficient current density to electrodeposit silicon as a continuous, coherent, firmly-retained, non-spongy, polycrystalline layer of non-alloyed silicon onto said substrate,
   (d) maintaining said bath in an essentially oxygen-free environment and at a temperature for said bath to be in a totally molten state.

2. The method of claim 1 in which said non-alloying substrate comprises a protective layer of said non-alloying metal over a body capable of alloying with silicon under the conditions of electrodeposition.

3. The method of claim 2 in which said non-alloying metal substrate is a continuous nonporous layer, essentially impervious to diffusion under the conditions of electrodeposition.

4. The method of claim 1 in which said non-alloying substrate is selected from the group consisting of silver and tungsten.

5. The method of claim 1 in which said non-alloying substrate comprises silver.

6. The method of claim 1 in which the current is direct and the current density is in the range of 0.1–30 milliamperes per square centimeter.

7. The method of claim 6 in which the polycrystalline layer has an average grain diameter of above 5 microns.

8. The method of claim 1 in which said current is applied by an alternating square wave pulse technique.

9. The method of claim 8 in which the cathode current density varies in the range of about 0.5 to about 100 milliamperes per square centimeter.

10. The method of claim 8 in which cathodic current density pulses up to 300 milliamperes per square centimeter, yield silicon deposits with cathodic current efficiencies of at least 80%.

11. The method of claim 1 in which an initial cathodic current density is applied different from the plating period to improve coating to control the nucleation rate and nuclei density of the deposited silicon uniformity and grain diameter.

12. The method of claim 11 in which said initial cathodic current density is higher than during the rest of the plating period in order to increase nuclei density and uniformity.

13. The method of claim 11 in which said initial cathodic current density is lower than the rest of the plating period in order to increase grain diameters.

14. The method of claim 1 including anodes selected from the group consisting of gold and carbon in which oxygen-containing impurities are removed from the molten bath by reacting with fluorine gas evolving from the molten bath at said anodes.

15. The method of claim 1 in which said silicon is electrodeposited with cathodic current efficiencies of at least 80%.

16. The method of claim 1 in which the temperature of said bath during electrodeposition is between about 650° C. and 800° C.

17. A body comprising a substrate of a metal essentially unalloyed with silicon, and non-alloyed silicon electrodeposited on said substrate in the form of a continuous, coherent, firmly-retained, non-spongy polycrystalline layer with an average grain diameter in excess of 20 microns.

18. The body of claim 17 in which said substrate metal comprises silver tungsten, or niobium.

19. The body of claim 17 in which said substrate metal comprises silver.

* * * * *